United States Patent [19]

Yamamoto et al.

[11] 4,233,506
[45] Nov. 11, 1980

[54] PHOTO-SENSOR

[75] Inventors: Hideaki Yamamoto; Makoto Matsui, both of Hachioji; Toshihisa Tsukada, Tokyo; Yoshizumi Eto, Sagamihara; Tadaaki Hirai, Koganei; Eiichi Maruyama, Kodaira, all of Japan

[73] Assignees: Nippon Telegraph and Telephone Public Corporation; Hitachi, Ltd., both of Japan

[21] Appl. No.: 903,161

[22] Filed: May 5, 1978

[30] Foreign Application Priority Data

May 13, 1977 [JP] Japan .................................. 52-54284

[51] Int. Cl.² .............................................. G02B 5/14
[52] U.S. Cl. .................................... 250/227; 250/551; 235/473
[58] Field of Search ................. 250/227, 551; 235/473

[56] References Cited

U.S. PATENT DOCUMENTS 3,786,238 1/1974 Heisner .......................... 250/227 X Primary Examiner—David C. Nelms
Assistant Examiner—Darwin R. Hostetter
Attorney, Agent, or Firm—Craig and Antonelli

[57] ABSTRACT

A photo-sensor wherein a bundle of optical fibers is disposed within a predetermined substrate, the optical fiber bundle extending from a first surface to a second surface of the substrate and being formed to be flat, an array of photosensitive elements which have photosensitive parts on an open end face of the optical fibers at the first surface of the substrate is disposed integrally with the substrate, and an end face of the optical fibers at the second surface of the substrate serves as an information reading surface.

22 Claims, 27 Drawing Figures

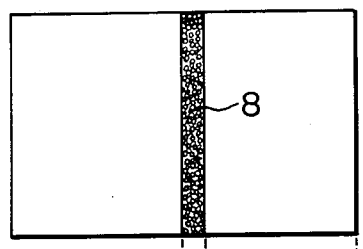
FIG. 4a
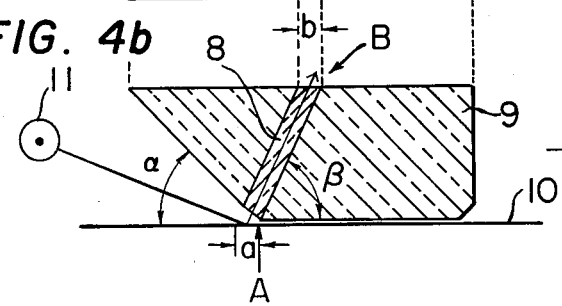
FIG. 4b
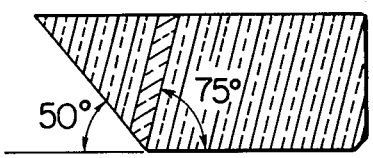
FIG. 6
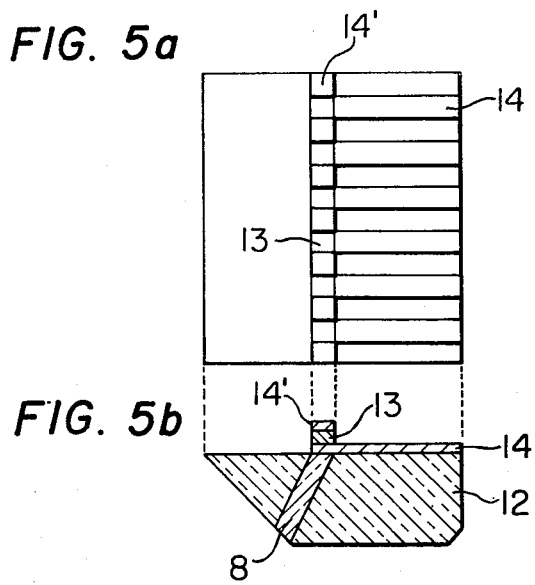
FIG. 5a
FIG. 5b
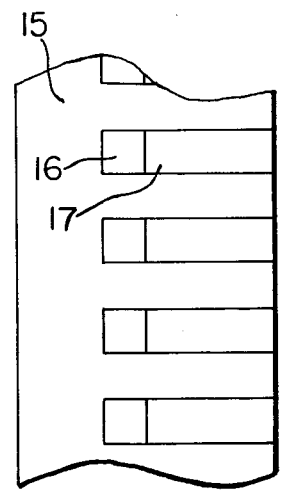
FIG. 7

PHOTO-SENSOR

BACKGROUND OF THE INVENTION

1. Field of the Invention

This invention relates to a photo-sensor for reading information such as characters and patterns. The photo-sensor of this invention is useful as the linear image sensor of a facsimile equipment or optical character recognition, etc.

2. Description of the Prior Art

Heretofore, a linear silicon photodiode array has been generally employed as the photosensitive element of a facsimile transmitter, optical character recognition etc. Since, however, silicon is subject to limitations in the size of a producible single crystal and in the processing technique, the length of the linear silicon photodiode array has a limit. At present, the length of the linear silicon photodiode array achievable is only about 30 mm at the utmost. On the other hand, an original picture to be read has a width of, for example, 210 mm in the A4-size. Accordingly, in case of reading the original picture of the A4-size with the linear silicon photodiode array, the original picture is scaled down and imaged on the linear silicon photodiode array by the use of a lens system.

FIG. 1 is a view for explaining this principle. Numeral 1 designates an original picture, numeral 2 a lens, and numeral 3 a linear silicon photodiode array. In this case, a certain distance is inevitably required between the original picture and the linear silicon photodiode array. This is very unfavorable for the miniaturization of the input device. In addition, in case of using such a lens system, there are the disadvantages that the positioning of the lens requires much labor and that a degraded resolution of a peripheral part and an insufficient quantity of light arise.

Recently, it has been attempted to eliminate the disadvantages of such a lens system by employing optical fibers as an optical system.

An example of the attempt is described in detail in, for example, "Gazo Denshi Gakkai Shi (Bulletin of the Picture Electronics Society)," vol. 4, No. 2, pp. 54–61 (1975). Hereunder, the technique will be briefly explained.

FIG. 2 is a view showing the operating principle of the prior art. In the figure, numeral 4 designates an original picture, and numeral 5 denotes 1,280 optical fibers each having a diameter of 125 $\mu$m. One side of the optical fibers close to the original picture is in the form of a sheet, while the other side is distributed to 20 linear silicon photodiode arrays ($S_1$-$S_{20}$). The linear silicon photodiode array consists of 64 photodiodes. FIG. 3 is an enlarged sectional view of the joined part between the optical fibers and the linear silicon photodiode array. In this figure, numerals 61–66 indicate optical fibers, and symbols $S_1$–$S_6$ silicon photodiodes. The pitch of the silicon photodiodes is indicated by D, the spacing between the silicon photodiode and the optical fiber is indicated by $d_1$, and the misalignment between the silicon photodiode and the optical fiber is indicated by $d_2$. The optical fibers and the photodiodes correspond at 1:1. In order to prevent the breakage of the photodiode, a clearance d of about several hundreds $\mu$m needs to be provided between the optical fiber and the photodiode. The clearance lowers the resolution of the photo-sensor drastically. After all, the photo-sensor having such a structure is meritorious over the photo-sensor employing the lens system in that the degradation of the resolution of the peripheral part and the insufficient quantity of light can be avoided, but it is not practical on account of disadvantages as listed below.

1. The optical fibers of the structure, in which one side is in the form of the very thin sheet and the other side is distributed to the 20 linear silicon photodiode arrays, eventually needs some extent of length. This is unfavorable for the miniaturization of the device. Moreover, there is a high possibility that the optical fibers will be broken by mechanical shocks such as vibrations.

2. Inasmuch as the optical fibers must be arrayed in perfect conformity with the pitch of the silicon photodiodes, fibers of high precision are required. The alignment takes much labor, and the position is prone to shift in the course of use.

3. In order to prevent the destruction of the linear silicon photodiode array, the optical fibers must be floated in use. This degrades the resolution drastically.

There will be explained how the spacing $d_1$ between the silicon photodiode and the optical fiber and the misalignment $d_2$ between them ought to be controlled in case of the device of this system.

When the spacing $d_1$ is varied, the ratio between the outputs of the silicon photodiodes $S_4$ and $S_5$ as based on light from the optical fiber 65 varies, by way of example, as follows:

At $d_1 = 20$ $\mu$m, $S_5/S_4 \sim 14$.

At $d_1 = 50$ $\mu$m, $S_5/S_4 \sim 10$.

At $d_1 = 100$ $\mu$m, $S_5/S_4 \sim 5$.

(In these examples, D = 125 $\mu$m and $d_2 = 0$ $\mu$m)

When the misalignment $d_2$ is varied, the ratio between the outputs of the silicon photodiodes $S_2$ and $S_1$ as based on light from the optical fiber 62 varies, by way of example, as follows:

At $d_2 = 5$ $\mu$m, $S_2/S_1 \sim 10$.

At $d_2 = 25$ $\mu$m, $S_2/S_1 \sim 4$.

At $d_2 = 45$ $\mu$m, $S_2/S_1 \sim 2$.

(In these examples, D = 125 $\mu$m and $d_1 = 50$ $\mu$m)

In order to separate the information of the adjacent optical fibers, therefore, an adjustment of considerably high precision is required. Since the picture information is turned into a binary signal, it is required in practice to make $d_2$ within $\pm 10$ $\mu$m at $d_1 = 50$ $\mu$m. The dimensional precision for this control is considerably high. In addition, the requirement for the dimensional precision becomes still higher to the end of enhancing the resolution, and a resolution of 4–5 lines/mm will be a limitation in actuality.

SUMMARY OF THE INVENTION

This invention has been made in order to eliminate the disadvantages of the prior arts. The photo-sensor of this invention is applicable to the photoelectric transducers of a facsimile equipment, optical character recognition, etc.

An object of this invention is to provide a photo-sensor which can read characters and patterns at high resolution without employing any lens system.

Another object of this invention is to provide a photo-sensor which can render the various apparatuses very small in size.

In order to accomplish the objects, the photo-sensor of this invention fundamentally adopts a construction as described below. Within a predetermined substrate, a bundle of optical fibers is disposed which extends from a first surface to a second surface. Photosensitive elements in the form of an array are disposed in such a manner that their photosensitive parts lie on an end face of the optical fibers at the first surface of the substrate. At this time, the photosensitive elements are made integral with the substrate by such an expedient as vacuum-deposition. The array of photosensitive elements is arranged in the main scanning direction for reading information. An end face of the optical fiber bundle at the second surface of the substrate functions as an information reading surface.

BRIEF DESCRIPTION OF THE DRAWINGS

FIGS. 5a and 5b are a plan view and a sectional view of a photo-sensor according to this invention, respectively, FIG. 6 is a sectional view of a fiber plate, FIG. 7 is a plan view of a fiber plate in the case where stripe electrodes are formed thereon.

DETAILED DESCRIPTION OF THE PREFERRED EMBODIMENTS

Figure 1:
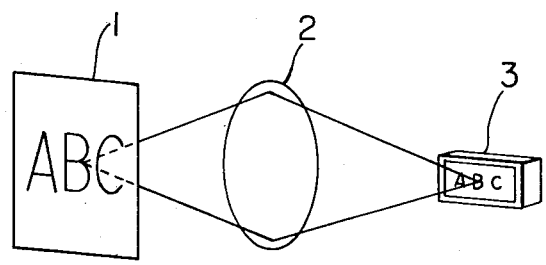
FIG. 1 is an explanatory view of a prior art employing a lens system.
Figure 2:
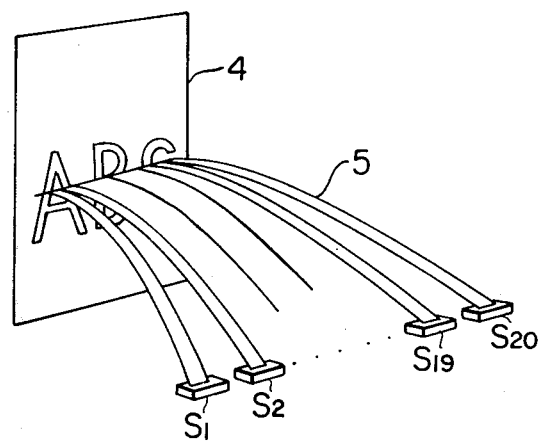
FIG. 2 is an explanatory view of a prior art employing optical fibers.
Figure 3:
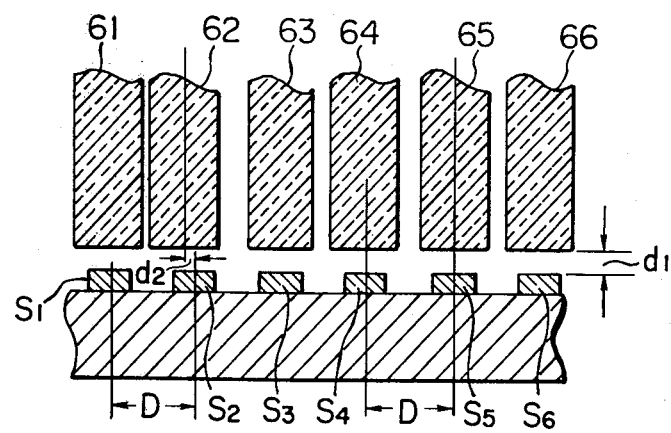
FIG. 3 is a sectional view for explaining the joined part between the optical fibers and photodiodes in the prior art of FIG. 2, FIGS. 4a and 4b are a plan view and a sectional view of a fiber plate used in this invention, respectively.

A typical example of a substrate for use in this invention is shown in FIG. 4a and FIG. 4b as a plan view and a sectional view, respectively. Numeral 8 designates a bundle of optical fibers. The bundle of optical fibers may be fabricated by bonding the optical fibers with a resin or the like. Alternatively, it can be readily fabricated by heating and collapsing the cladding parts of the optical fibers. Numeral 9 designates a material to which the optical fibers 8 can easily adhere. By way of example, it may be flocks of the same fibers as those shown at 8, or it may be a plate such as glass plate. The thickness of the substrate may be set according to requirements of a device. In order to meet the requirement of miniaturization, thicknesses of approximately 2 mm–15 mm are adopted. Shown at 10 is an original picture, which is an information surface. Numeral 11 indicates a light source. Usable as the light source are an electric lamp, a fluorescent lamp, a light emitting diode, etc. In general, the illumination at the information surface is on the order of several tens lx to several hundreds lx.

The substrate for disposing photosensitive elements thereon as thus far described shall be called the "fiber plate." The fiber plate exemplified in FIG. 4 has its left end cut obliquely at an angle $\alpha$. This serves for effectively entering light. The light emergent from the light source 11 is scattered on the surface of the original picture 10 as indicated by an arrow in FIG. 4b. In this case, only the light scattered within a range of a width a near a point A enters the optical fibers 8. The light emerges from plate 9 in a region of a width b near a point B on the surface of the fiber plate. Accordingly, if the photosensitive elements are disposed at the position of the point B, information such as characters in the vicinity of the point A in the original picture can be read. At this time, in order to read the original picture at high resolution and to use the light efficiently, the angle $\alpha$ and the widths a and b must be selected as described below. When the angle $\alpha$ is great, the quantity of the entering light increases, but a region which can be read at good resolution is limited to the close proximity to the point A. The reason therefor is that, when the clearance between the original picture and the optical fibers becomes large, the image of the region of the width b near the point B blurs. In consequence, the area of the photosensitive parts of the photosensitive elements to be disposed near the point B must be made small. This is undesirable in rendering a signal current low. Conversely, when the angle $\alpha$ is small, the region which can be read at good resolution becomes large, but undesirably the quantity of the entering light decreases. Further, the optical fibers are buried at an angle $\beta$ with respect to the plane of the substrate. When the angle $\beta$ is small, not only light scattered from the part of the original picture to be read (signal component) but also light scattered from other parts enter the fibers shown at 8. This lowers the signal-to-noise ratio undesirably. On the other hand, when the angle $\beta$ is too great, the region which can be read becomes small, and this is also undesirable. Ordinarily, the angle $\alpha$ is selected within a range of 20°–80°, and the angle $\beta$ within a range of 30°–80°. More preferably, $\alpha$ is selected within a range of 50°–70°, and $\beta$ within a range of 50°–80°. The angle $\alpha$ is determined by taking into account the quantity of the entering light, the light receiving area of the photodiodes, the required resolution, etc. Also the angle β has the optimum value determined from the signal-to-noise ratio and the light receiving area of the photodiodes. The fact that a bottom part at the right end of the fiber plate is obliquely cut, tends to smoothly introduce the original picture underneath the fiber plate irrespective of whether the original picture is inserted from the left side or right side.

FIGS. 5a and 5b show a plan view and a sectional side elevation in the case where a linear photodiode array is disposed as photosensitive elements on a fiber plate, respectively. In the figures, numeral 12 designates a fiber plate, and numeral 13 a photosensitive material. Numerals 14 and 14' designate a lower electrode and an upper electrode, respectively. Needless to say, at least that part of the lower electrode 14 which forms a photosensitive part is transparent. The lower electrodes 14 and the upper electrodes 14' are alternate, and the photoelectric material parts 13 are disposed in the intersecting regions in a manner to be held between the electrodes. In this example, the upper electrodes are constructed of a common electrode, and the lower electrodes are stripe electrodes. In many cases, one of the two sorts of electrodes and the photosensitive material form a diode, and the photosensitive element operates as the photodiode. As the photosensitive material, there can be used a photoelectric material which can be prepared by vacuum-deposition. It includes, for example, an amorphous semiconductor of Se-As-Te system, CdSe, CdTe, PbS, etc.

As regards this type of photo-sensor, a resolution of 4 lines/mm to 8 lines/mm is usually required. In the case where the resolution is about 4 lines/mm, the area of the photodiode 13 is approximately 200 $\mu m \times 200$ $\mu m$. In the case where the former is about 8 lines/mm, the latter is approximately 100 $\mu m \times 100$ $\mu m$. Accordingly, when the diameter of optical fibers is selected at about 20 $\mu m$ in advance, it becomes unnecessary to exactly adjust the positions of the photodiode and the fiber. When the diameter of the optical fibers is selected to be sufficiently smaller than the area of the photosensitive parts of the photosensitive elements, the fabrication of the photo-sensor is very easy. Since various kinds of optical fibers are commonly produced at diameters of or above 5 $\mu m$, this result can be readily realized.

Although the typical example of the fiber plate has been described, it is needless to say that the invention is not restricted to the illustrated aspect. For example, the end face of the optical fibers may be located at a side surface of the substrate. It is also possible to construct the fiber plate by the use of two or more components. A laminated plate is an example in this case.

The photo-sensor of this invention as explained above has the following advantages:
1. As no lens system is employed, apparatus employing the photo-sensor can be miniaturized, and the original picture can be read without any substantial optical adjustments.
2. A resolution of about 8 lines/mm can be achieved.
3. Since no lens system is employed, the utilization factor of light is high, and hence, the illuminating light source may be of low intensity.
4. Since the photosensitive elements are formed by the vacuum-deposition, the elongation of the photodiode array is easy.
5. The method of fabrication is extraordinarily easy.
6. A low cost can be realized.

Hereunder, this invention will be described more in detail with reference to embodiments.

Figure 8A:
FIGS. 8a through 8f are sectional views of a photo-sensor which illustrate the manufacturing steps of the photo-sensor of this invention in succession.
Figure 8B:
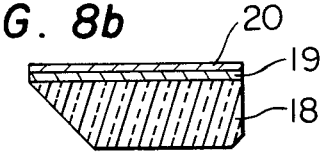
Figure 8C:
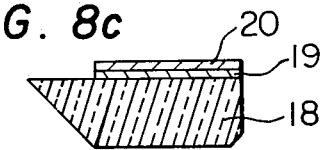
Figure 8D:
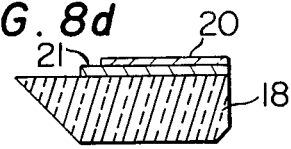
Figure 8E:
Figure 8F:
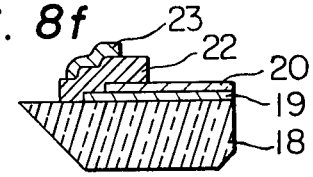

Embodiment 1:

The construction of a fiber plate used here is shown in FIG. 6. It is a plate obtained by putting optical fibers together and fusing and bonding them. The respective fibers are buried at an angle of 75° with respect to the bottom surface of the plate. The left end of the plate is cut at an angle of 50° so that light may enter. The optical fibers employed here have a diameter of 25 $\mu m$. FIG. 7 is a plan view of an electrode structure in the case where an array of photosensitive elements is disposed on the fiber plate. Sectional views for explaining the manufacturing steps of a photo-sensor are given in FIGS. 8a–8f. Referring to FIG. 7, numeral 15 designates a fiber plate, numeral 16 an $SnO_2$ transparent electrode, and numeral 17 a Cr electrode. The width of the electrodes is 200 $\mu m$, and the spacing between the electrodes is 250 $\mu m$. Referring to FIGS. 8a–8f, the fabricating procedures of the photo-sensor will be explained. An $SnO_2$ transparent electrode film 19 is deposited to a thickness of 100 nm on the surface of a fiber plate 18 shown in FIG. 8a, and a Cr film 20 is formed to a thickness of 100 nm on the $SnO_2$ film 19 by the vacuum-deposition (FIG. 8b). Unnecessary parts of the Cr film 20 are removed by the conventional photoresist process, to form stripe Cr electrodes. Using the remaining Cr film 20 as a mask, unnecessary parts of the $SnO_2$ transparent conductive film 19 are removed by the ion-beam etching (FIG. 8c). Lastly, the front end parts of the Cr stripes are removed by the photoresist process. Then, windows 21 of the transparent electrodes for entering light are formed as shown in FIG. 8d. On the stripe electrodes thus obtained, an Se-As-Te system amorphous semiconductor layer 22 having a thickness of 2 $\mu m$ is formed (FIG. 8e). The amorphous semiconductor layer is formed by preparing the respective evaporation sources of Se, As and Te and executing the mask-evaporation under a pressure of $2 \times 10^{-4}$ Pa ($\sim 10^{-6}$ Torr). As the thickness of the layer, a value of 0.5 $\mu m$–5 $\mu m$ is practical. The fabrication of the photosensitive material layer may well be done by the sputtering or the electron-beam evaporation. Further, an upper electrode which is made of a metallic thin film 23 of gold (Au) or the like is formed on the amorphous semiconductor layer 22 by the mask-evaporation (FIG. 8f). In this example, a P-N junction is formed by tin oxide ($SnO_2$) of the transparent electrode 19 and the Se-As-Te system amorphous semiconductor 22, and it operates as a photodiode. In this way, a linear image sensor has been formed on the fiber plate. Those parts of the stripe electrodes which are other than the windows for the entrance of light 21 are covered with the chromium film and are opaque. Accordingly, the light receiving area of each photodiode is equal to the area of the transparent electrode window 21.

Figure 9:
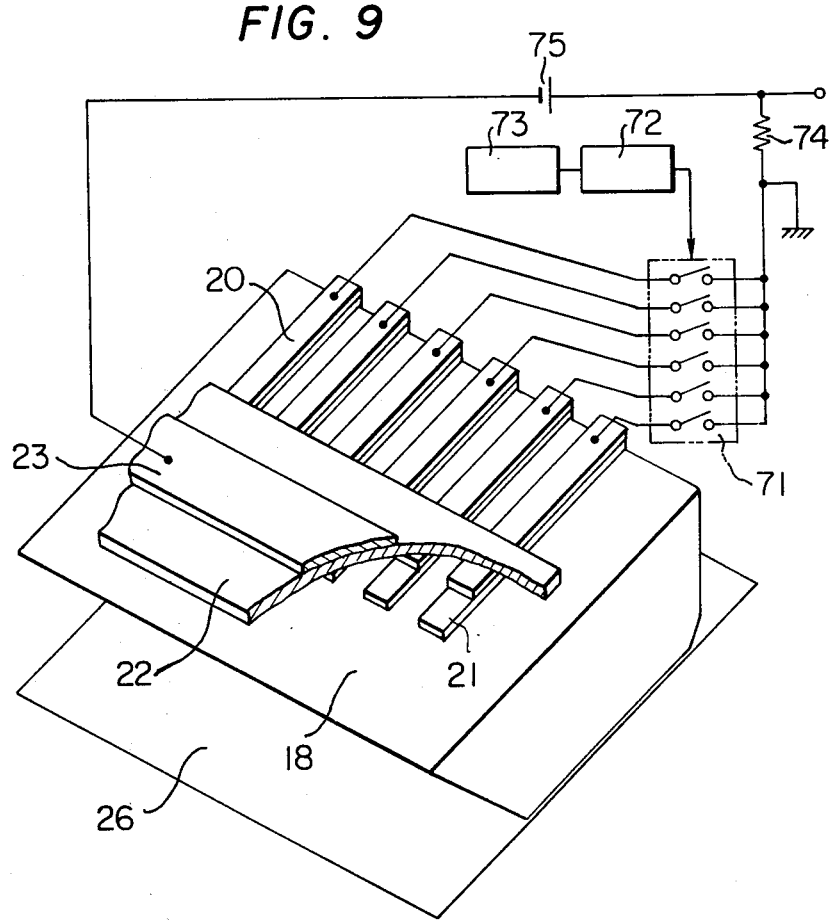
FIG. 9 is an explanatory view showing the essential portions of a photo-sensor and driver circuitry.
Figure 10:
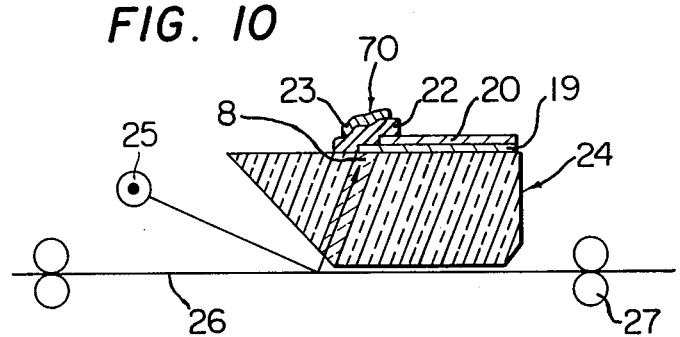
FIG. 10 is a sectional view of a device showing an example of use of this invention.

An example of use of the photo-sensor of the present embodiment will now be explained. FIG. 9 shows an apparatus including circuitry for deriving signals, while FIG. 10 shows a section of the photo-sensor.

Numeral 24 designates the photo-sensor described above, numeral 25 a light source for illumination such as elongate tungsten lamp and fluorescent lamp, numeral 26 an original picture, and numeral 27 rollers for moving the original picture. Light emergent from the light source 25 is scattered on the original picture 26 as indicated by an arrow, and enters photodiodes 70 through the optical fibers 8. The information of the original picture can be converted into electric signals by the photodiodes. The electric signals are successively taken out of the photo-sensor by a driver circuit which is constructed of a MOS switching circuit 71, a shift register 72 and a clock pulse generator 73. Numeral 74 denotes an output resistance, and numeral 75 a d.c. power source. The bias voltage was made 25 V in the example of use. The I-V characteristics of the respective photodiodes were as given in Table 1.

TABLE 1

| Applied voltage | 10 1× | 50 1× | 100 1× | 500 1× |
| --- | --- | --- | --- | --- |
| 5 V | 8 × 10 | 2.5 × 10$^2$ | 3 × 10$^2$ | 8 × 10$^2$ |
| 10 V | 2 × 10$^2$ | 7 × 10$^2$ | 9.5 × 10$^2$ | 2 × 10$^3$ |
| 20 V | 2 × 10$^2$ (in pA) | 1 × 10$^3$ | 1.5 × 10$^3$ | 6 × 10$^3$ |

In this manner, the photo-sensor wherein the linear photodiode array is integrally provided on the fiber plate can read the information by merely putting it on the original picture, and it does not require the adjustment of a lens system. Here will be explained a method of illumination for enhancing the utilization factor of light.

Figure 11:
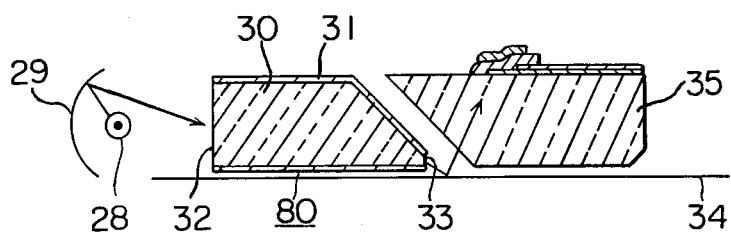
FIG. 11 is a sectional view of a device in the case where an optical guide is employed for illumination.

FIG. 11 is a sectional view of a device showing an example in which an optical guide is employed for illumination. Numeral 28 designates a light source such as tungsten lamp and fluorescent lamp. Light emergent from the light source 28 is reflected by a reflector 29, and is focused on an optical guide 80. The optical guide 80 is constructed in such a way that a plate 30 of a transparent material such as glass is covered with a metal such as Al 31 except its parts of an entrance surface 32 and an exit surface 33 for light. The light emergent from the exit of the optical guide is scattered on an original picture 34 and enters a linear diode array 35. This method raises the utilization factor of the light, and simultaneously prevents the photodiodes from undergoing a temperature rise due to the radiation heat of the light source.

Figure 12:
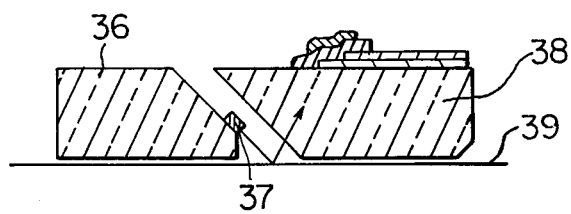
FIG. 12 is a sectional view of a device in the case where a light emitting diode is employed as a light source.

FIG. 12 is an explanatory view in the case of employing a light emitting diode as a light source. Numeral 36 indicates a metallic block serving also as a heat sink. In order to uniformly illuminate an original picture, a light emitting diode array 37 in which light emitting diodes are arranged at equal intervals is mounted on the fore end of the metallic block 36. Light scattered by the original picture 39 enters the photo-sensor 38. An advantage of this method is that the light emitting diodes are small. Moreover, since they are the light source of low temperature, they can be brought extremely close to the part of the original picture 39 to be read. Accordingly, the utilization factor of light is remarkably enhanced.

Figure 13:
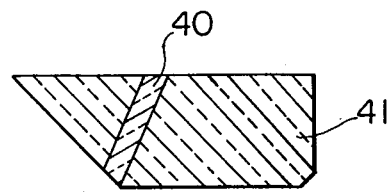
FIG. 13 is a sectional view of a fiber plate in which a substrate is made opaque except a fiber portion.
Figure 14A:
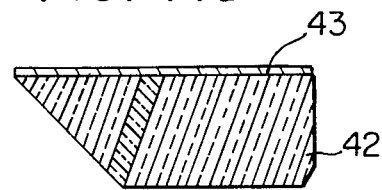
FIGS. 14a through 14c are sectional views of a photo-sensor which illustrate another process for manufacturing the photo-sensor of this invention.

Embodiment 2:

A sectional view of a fiber plate used in this example is shown in FIG. 13. The difference between this fiber plate and that of the fiber plate of Embodiment 1 is that optical fibers 40 are used only at a part at which photodiodes are disposed, while the other part is made of an optically opaque material (for example, colored glass of black). Transparent glass may be used for the plate, and at this time, a light intercepting film is necessary as in Embodiment 1. A method of forming this photo-sensor will now be explained in the order of manufacturing steps. FIG. 14a shows the fiber plate 42 described above. A transparent conductor film 43 made of indium oxide In$_2$O$_3$ is deposited 1,000 Å on the fiber plate 42 (tin oxide SnO$_2$, etc. may be used for the film 43). The transparent conductor film 43 is worked into the shape of stripes by the well-known chemical etching process which uses the photoresist for a mask. In case where the transparent conductor 43 is tin oxide, it is worked into the shape of stripes by the well-known ion-beam etching process by the use of the photoresist for a mask. On the stripe electrodes 44 thus formed (FIG. 14b), a layer 45 of a photosensitive material is formed by the vacuum-evaporation employing a mask. Such photosensitive material layers are as listed in Table 2.

TABLE 2

| | Thickness (μm) |
| --- | --- |
| Se-As-Te | 2 |
| CdSe | 10 |
| CdTe | 2 |
| PbS | 1 |

Figure 14C:
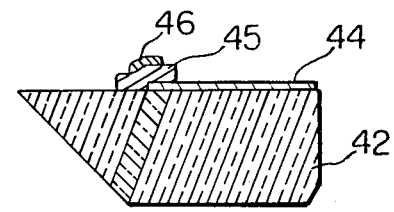
Figure 14B:
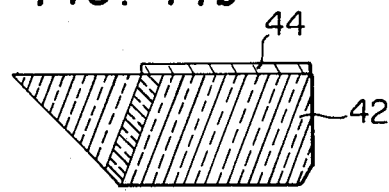

Further, an upper electrode made of a metal thin film 46 is formed on the photosensitive material layer 45 by the mask-evaporation (FIG. 14c). Then, an array of photoelectric elements has been formed on the fiber plate.

In Embodiment 2 described above, the optical fibers themselves serve as windows for the entrance of light, so that the chromium film as in Embodiment 1 is dispensed with. Therefore, the number of manufacturing steps can be reduced.

Figure 15:
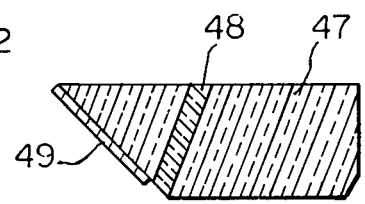
FIG. 15 is a sectional view of a fiber plate which has a reflective film.

Embodiment 3:

FIG. 15 shows a sectional view of a fiber plate used here. This plate is an example wherein the plate as described in Embodiment 1 or Embodiment 2 is provided with a reflective film. Numeral 48 designates an optical fiber portion, and numeral 49 an evaporated film of Al, Cr or the like for reflecting light. The evaporated film 49 is formed by the mask-evaporation or any working process employing the photoresist. The reflecting evaporated film 49 is disposed in order to prevent light from entering from the other part than the required fiber portion. An array of photosensitive elements is formed on the fiber plate by quite the same method as in Embodiment 2. In case of Embodiment 2, the unnecessary light is absorbed, whereas in case of Embodiment 3, the light is reflected, which is advantageous in enhancing the utilization factor of light.

Figure 16:
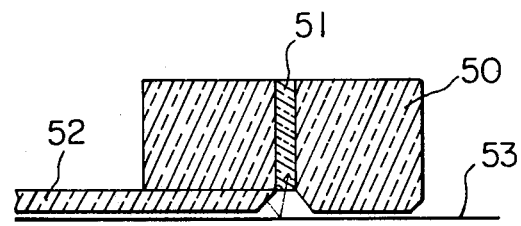
FIG. 16 is a sectional view of a fiber plate in which optical fibers are buried vertically to a substrate.
Figure 17:
FIG. 17 is a view showing an optical guide which employs sheet-like optical fibers.
Figure 18:
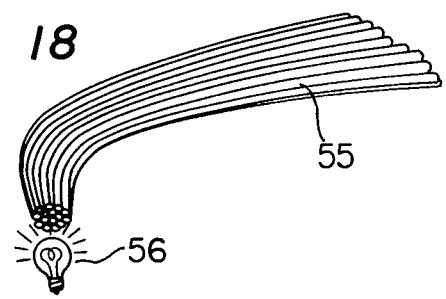
FIG. 18 is an explanatory view showing an optical guide which is in the shape of a sheet at one end and circular at the other end.

Embodiment 4:

In the embodiments described thus far, the optical fibers are buried obliquely to the plane of the fiber plate. However, the optical fibers may well be buried vertically to the plane of the plate. FIG. 16 shows a sectional view of such an example. Numeral 50 designates a plate made of a material which can be readily bonded with optical fibers 51 (for example, a glass plate which is either transparent or opaque). It is also allowed to make the whole structure a bundle of optical fibers. In this case, a predetermined light-intercepting film needs, of course, to be provided. The bundle of optical fibers 51 is arranged perpendicularly to the surface of the plate 50. A part of the bottom of such a plate is removed. In the resultant hollow, an optical guide 52 which guides light for illuminating an original picture 53 is placed. Although the optical guide 52 may be a thin glass plate, the use of a structure in which optical fibers are arranged in the form of a sheet is more meritorious when the utilization factor of light is taken into account. Such a structure is shown in FIG. 17. In this figure, numeral 54 indicates optical fibers. The front ends of the respective fibers are obliquely cut as illustrated in FIG. 17. This serves to illuminate the original picture more effectively. The optical guide made of the optical fibers must employ an elongate light source in the case as illustrated in FIG. 17. In this respect, an optical guide 55 one end of which is in the shape of a sheet and the other end of which is circular as depicted in FIG. 18 has the advantage that a single electric lamp 56 suffices. A linear photodiode array is formed on the aforecited fiber plate by quite the same method as in Embodiment 2. Then, a photo-sensor is completed.

What is claimed is:

1. A photo-sensor comprising a predetermined substrate, a bundle of optical fibers which is disposed in said substrate and which extends from a first surface to a second surface of said substrate, and an array of photosensitive elements which is integrated onto said substrate, said photosensitive elements having photosensitive parts on an end face of said optical fibers at said first surface of said substrate, an
end face of said optical fibers at said second surface of said substrate serving as an information reading surface.

2. A photo-sensor comprising a predetermined substrate, a bundle of optical fibers which is disposed in said substrate, which extends from a first surface to a second surface of said substrate and which is formed in the shape of a sheet, and an array of photosensitive elements which is integrated onto said substrate, said photosensitive elements having photosensitive parts on an end face of said optical fibers at said first surface of said substrate, an end face of said optical fibers at said second surface of said substrate serving as an information reading surface.

3. A photo-sensor according to claim 2, wherein said bundle of optical fibers is formed to be flat.

4. A photo-sensor according to claim 3, wherein said substrate has a third surface which intersects at an acute angle α with at least extensions of said second surfaces of said substrate to which said optical fibers are open, said optical fibers intersect at an angle β with said first surface of said substrate, and said end face of said fibers at said second surface of said substrate is open near a line of intersection between said second surface of said substrate and that part of said third surface of said substrate which lies on an information surface side.

5. A photo-sensor according to claim 4, wherein said angle α is 20°–80°, and said angle β is 30°–80°.

6. A photo-sensor according to claim 4, wherein said angle α is 50°–70°, and said angle β is 50°–80°.

7. A photo-sensor according to claim 3, wherein said first and second surfaces of said substrate to which said optical fibers are open are substantially parallel, said substrate has a third surface which is substantially parallel to said second surface of said substrate and which protrudes beyond said second surface and adjoins said second surface with a level difference, and said third surface is a surface which contacts with an information surface.

8. A photo-sensor according to claim 7, wherein said optical fibers intersect orthogonally to said first surface of said substrate.

9. A photo-sensor according to claim 4, wherein a light reflecting film is disposed on said second surface of said substrate except at least a predetermined part on said end face of said optical fibers.

10. A photo-sensor according to claim 1, wherein said substrate is constructed of a bundle of optical fibers, and a predetermined portion of these optical fibers forms an information transmitting part.

11. A photo-sensor according to claim 2, wherein said substrate is constructed of a bundle of optical fibers, and a predetermined portion of these optical fibers forms an information transmitting part.

12. A photo-sensor according to claim 4, wherein said substrate is constructed of a bundle of optical fibers, and a predetermined portion of these optical fibers forms an information transmitting part.

13. A photo-sensor according to claim 1, wherein said substrate is made of glass.

14. A photo-sensor according to claim 2, wherein said substrate is made of glass.

15. A photo-sensor according to claim 4, wherein said substrate is made of glass.

16. A photo-sensor according to claim 1, wherein said photosensitive elements are integrated onto said substrate in such a manner that transparent electrodes, a photosensitive material layer and upper electrodes are stacked on said substrate in the order mentioned.

17. A photo-sensor according to claim 2, wherein said photosensitive elements are integrated onto said said substrate in such a manner that transparent electrodes, a photosensitive material layer and upper electrodes are stacked on said substrate in the order mentioned.

18. A photo-sensor according to claim 4, wherein said photosensitive elements are integrated onto said substrate in such a manner that transparent electrodes, a photosensitive material layer and upper electrodes are stacked on said substrate in the order mentioned.

19. A photo-sensor according to claim 1 wherein the photosensitive element has at least a body of a photosensitive material made by an evaporation method.

20. A photo-sensor according to claim 2 wherein the photosensitive element has at least a body of photosensitive material made by an evaporation method.

21. A photo-sensor according to claims 16, 17, or 18, wherein the photosensitive material layer is made by an evaporation method.

22. A photo-sensor according to claim 1, wherein said photosensitive elements comprise, at least,
a transparent electrode,
an opaque film covering said electrode to produce a window,
a semiconductor layer formed on said electrode to produce a P-N junction over at least a portion of the surface of said window, and
a second electrode formed on said semiconductor layer.

* * * * *